United States Patent [19]
Chen et al.

[11] Patent Number: 6,098,024
[45] Date of Patent: Aug. 1, 2000

[54] SYSTEM FOR PROCESS DATA ASSOCIATION USING LAPLACE EVERETT INTERPOLATION

[75] Inventors: Ming Chun Chen, Milpitas; Paul J. Steffan, Elk Grove, both of Calif.

[73] Assignee: Advanced Micro Devices, Inc., Sunnyvale, Calif.

[21] Appl. No.: 08/985,468

[22] Filed: Dec. 5, 1997

[51] Int. Cl.[7] .................................................. G06F 19/00
[52] U.S. Cl. ........................ 702/81; 702/83; 702/84; 702/181; 700/109; 700/121
[58] Field of Search ............................. 702/81–84, 33, 702/97, 105, 113–115, 126, 155–159, 166, 170–172, 179, 181–185, 198, FOR 155, FOR 169–FOR 172, FOR 145–FOR 149, FOR 139, FOR 123, FOR 124, FOR 135–FOR 137; 438/10, 14–18; 700/117–121, 303, 108–110; 382/141, 145, 147–152

[56] References Cited

U.S. PATENT DOCUMENTS 5,787,190  7/1998  Peng et al. ................................ 438/10
5,866,437  2/1999  Chen et al. ............................... 438/14
5,940,300  8/1999  Ozaki ....................................... 700/121

Primary Examiner—Hal Wachsman
Attorney, Agent, or Firm—H. Donald Nelson

[57] ABSTRACT

A method of utilizing associated process data parameters in the manufacture of semiconductor wafers by converting tool-based data to lot based data in order to predict wafer electrical test results from measured in-line critical dimensions, lot based data and the converted tool-based data. The converted tool-based data is obtained by interpolating data between a measurement obtained from a tool at a first time and a measurement obtained from the tool at a second time. The data association is obtained using LaPlace-Everett interpolation. The converted tool-based data can also be obtained by extrapolating data from the historical measurements taken from the tool.

2 Claims, 3 Drawing Sheets

SYSTEM FOR PROCESS DATA ASSOCIATION USING LAPLACE EVERETT INTERPOLATION

BACKGROUND OF THE INVENTION

1. Field of the Invention

This invention relates generally to the manufacture of high-performance semiconductor integrated circuits. More specifically, this invention relates to a system to associate measured data parameters for specific manufacturing equipment to a particular wafer lot. Even more specifically, this invention relates to a system to associate measured data parameters for specific manufacturing equipment to a particular wafer lot using an interpolation tool or an extrapolation tool.

2. Discussion of the Related Art

In the typical semiconductor manufacturing facility, many simulation and analysis tools have been implemented to assist the process integration and device development efforts. These simulation and analysis tools, however, are typically employed to provide an indication of general trends. The latent potential of reducing the number of silicon runs and speeding up the process optimization cycle has not been fully achieved. One of the primary reasons the process optimization cycle has not been achieved is that the accuracy of the data obtained cannot be established to the degree necessary to determine the dependability of the simulations systems. The accuracy of the data obtained can only be achieved by a complete and detailed engineering calibration of the simulation system. This calibration, however, demands extensive engineering resources and data from multiple silicon production runs which, in turn, is usually only available at the latter stages of the process development or early production cycles.

In addition, process optimization for a technology that has completed qualification and is ramping-up production could receive great benefit from the extensive embedded device physics contained in advanced complex simulation tools. Despite this extensive knowledge base, statistical data analyzing tools dominate, to the near exclusion of device simulation tools, as the tools employed in the decision making process in modem semiconductor manufacturing facilities.

The main reasons for this are as follows:

1. The manufacturing data is fundamentally statistical. It is usually impossible to control, much less measure exact values for many process parameters. Moreover, if the simulation, or even the actual silicon itself, yields only a single data point without accompanying distribution information, that result is usually insufficient to justify any qualified decision.
2. Process monitoring and optimization is an ongoing and reiterative sequence of fine-tuning that is dependent upon barely measurable differences which are affected by statistical fluctuation in process and complicated interactions between various process parameters. Therefore, a truly useful tool that an engineer can trust must provide a high order of data accuracy.
3. Vast amounts of process variables, in-line measurements and electrical data are continually collected in the manufacturing facility (fab). Current existing simulation tools, however, cannot effectively utilize this data.

Problematically, statistical analysis alone, without integration of the existing knowledge of device physics and simulation skills, is neither flexible nor powerful enough to handle engineering changes in the process without sufficient accurate actual data from the silicon itself.

The typical semiconductor fabrication plant has a vast array of process tools that interact with silicon wafers in quantifiable ways. These interactions can be associated with either the tool, which is acting on the wafer, or with the wafer itself, which has been acted upon. For example, a metal deposition tool might have a film thickness deposited, film resistance, granularity, clarity, step coverage, hillock density etc., which could be related to the wafer. The metal deposition tool also will have a deposition rate, deposition power, film uniformity, sputter etch rate, deposition temperature, target utilization, time since last PM (preventative maintenance), last particle count data, etc., which could be associated with the tool. These types of associated can be thought of as either Entity Based, which are parameters that are descriptive of, or are of special interest to, the tool, or they may be thought of as Lot Based, which are parameters that quantify the change to the wafer. All of this data, either lot based or entity based can be stored in a large associative database. Additionally, whether the data be lot based or entity based, information of importance to the tool is associated exclusively with the lot, or vice versa, making the accessing of that additional data difficult from the other viewpoint.

A major problem is the difficulty in relating the entity-based data to a particular wafer lot. For example, a lot is processed through a certain metal deposition tool. Currently, all of the film qualities as deposited on the wafer can be easily accessed since they are lot-based. However, it is difficult to determine what the tool-based post PM particle count that was performed three days before. This is because there is no current associative link between entity-based data and the lot such that a value can be assigned. Additionally, if a link were established, there is no current method to determine the value to be assigned to the data. For example, a post PM particle count on Monday has a count of 200 and the count the following Monday is 450. If a lot is processed on Friday, there is no way to determine what value is to be used.

Therefore, what is needed is a method that can relate entity-based data to a particular lot relating to what was done to the equipment around the time when the lot was processed or that can relate lot-based data to a particular tool relating to what wafer level parameters were measured on wafer lots passing through the tool.

SUMMARY OF THE INVENTION

A system for process data association using LaPlace-Everett Interpolation in accordance with the present invention solves the above and other problems associated with associating entity-based data to a particular wafer lot and vice versa.

The above and other objects and advantages of the present invention are attained through a system that when provided with a single lot number input, the system gathers all lot based data associated with the lot. Within the lot base data the system identifies all entities that have affected the lot and gathers all the entity based data that encompasses the lot. The system applies an interpolation, such as the LaPlace-Everett interpolation to the chronological entity data to derive a single "lot based" entity value for each parameter that can be assigned to the lot. The extended dataset is more descriptive of the lot and will provide a more accurate prediction capability.

The system, in accordance with the presence invention, provides a comprehensive table containing all data that directly or indirectly relates to a particular lot/process or tool/time-span. The enhanced dataset is then used to predict yield, to predict a response at a future process step, or to predict an expected outcome.

The system, in accordance with the present invention, provides a methodology to assign a weighted value to a lot that is processed at some point between the collection of entity based data. The LaPlace-Everett Interpolation is based on the number of lot/wafers processed since the previous entity value is ascertained and the number of lot/wafers processed until the following value is obtained. The LaPlace-Everett Interpolation then assigns a single interpolated value to a lot processed between the two collected entity data points.

The system, in accordance with the present invention, provides a methodology to assign a weighted value to a lot that is processed after the collection of data from a selected tool by extrapolating data from the historical record of the tool to obtain a current tool based data value.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
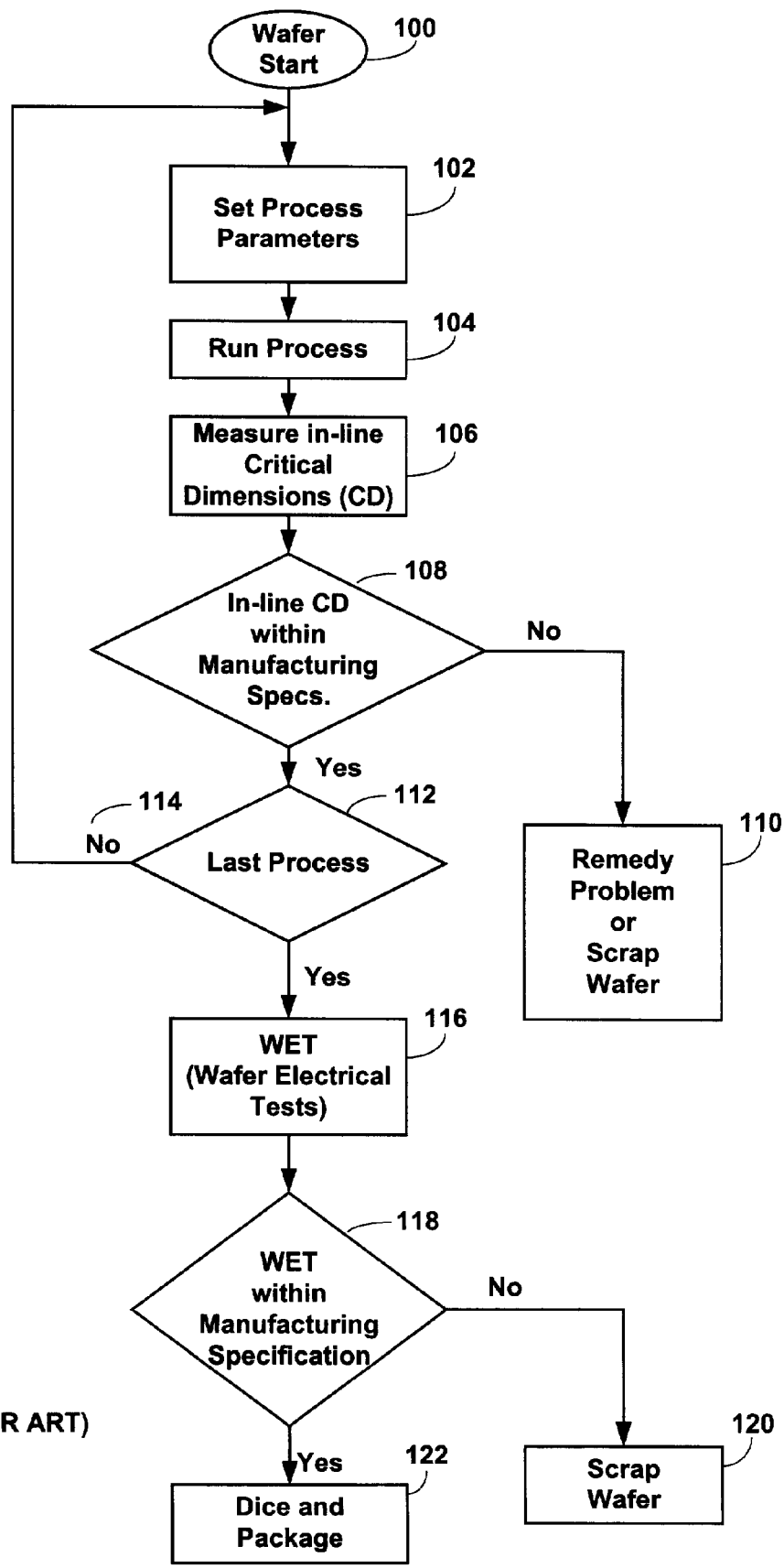
FIG. 1 shows a prior art wafer manufacturing process flow.

FIG. 1 shows a prior art wafer manufacturing process flow. A wafer lot is started at 100. The process parameters are set in the process equipment at 102 to run the first process. The process is run as shown at 104. After the process is completed, in-line critical dimensions (CD) are measured at 106. A determination at 108 is made whether the in-line critical dimensions are within a pre-established manufacturing specification. If the in-line critical dimensions are outside the pre-established manufacturing specification, the wafer lot is scrapped or a remedy is found as shown at 110. If a remedy is found, the wafer lot is returned to the process flow. If the in-line critical dimensions are within the manufacturing specification, a determination is made at 112 to determine whether the wafer has completed the last process. If it is not the last process, the wafer is sent to the next process as indicated at 114. If the wafer has completed the last process, the wafer is subjected to the wafer electrical tests (WET) as indicated at 116. A determination is made at 118 if the wafer electrical tests are within the pre-established manufacturing specifications. If the wafer electrical tests are not within the pre-established manufacturing specifications, the wafer lot is scrapped as indicated at 120. If the wafer electrical tests are within the pre-established manufacturing specification, the wafer is sent to the next step in the process, as indicated at 122, which could be a dice and package step.

Figure 2:
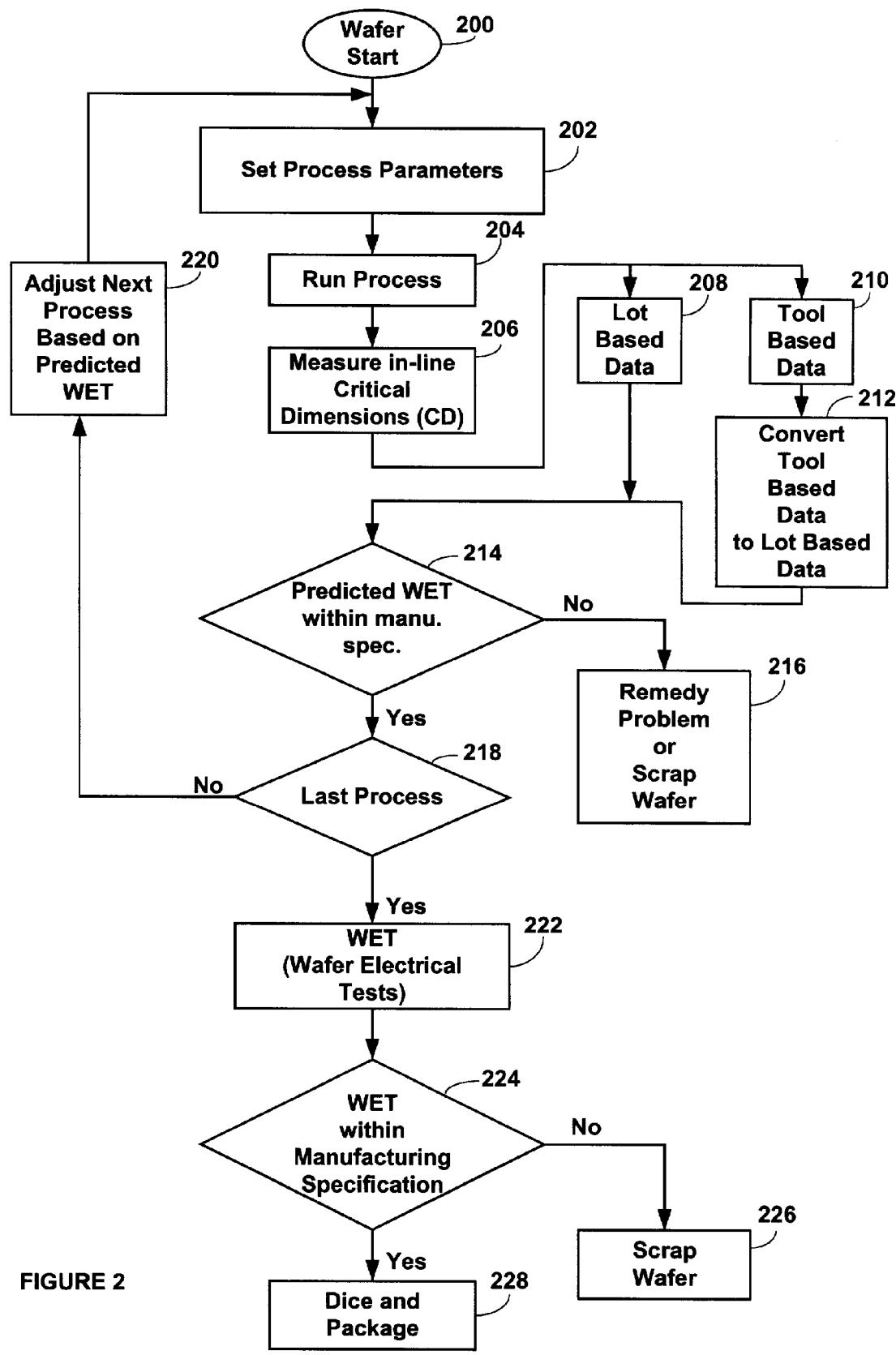
FIG. 2 shows a wafer manufacturing process flow in accordance with the present invention.

Referring to FIG. 2 there is shown a wafer manufacturing process flow in accordance with the present invention. A wafer lot is started at 200. The process parameters are set in the process equipment at 202 to run the first process. The process is run as shown at 204. After the process is completed, in-line critical dimensions (CD) are measured at 206. Wafer lot based data at 208 and tool based data at 210 that is converted to lot based data at 212 is used in conjunction with the in-line critical dimensions measured at 206 to determine predicted WET data which is obtained when the wafer has completed fabrication. A determination of whether the predicted WET data is within the manufacturing specification is made at 214. An example of lot based data associated with a metal deposition tool may be the film thickness deposited, film resistance, granularity, clarity, step coverage or hillock density. The lot base data can be directly associated with the lot. However, the metal deposition tool will have a deposition rate, deposition power, film uniformity, sputter etch rate, deposition temperature, target utilization, time since last preventative maintenance or last particle count data that is not directly associated with the lot. This type of data is the tool based data that must be converted to data applicable with the wafer being processed. It should be understood that the examples of lot based data and tool based data are given for illustrative purposes only and other tools will have different lot based/tool based data.

If it is determined at 214 that the predicted WET data is not within the manufacturing specification, the wafer lot is either scrapped or a remedy found as indicated at 216. If a remedy is found, the wafer lot is returned to the manufacturing process. If it is determined at 214 that the predicted WET data is within the manufacturing specification, it is determined at 218 whether the process just run is the last process. If it is not the last process, the wafer is sent to the next process. The next process parameters are adjusted at 220 in response to the predicted WET results at 214. These adjustments may include an adjustment of one parameter because of a measured value of another parameter. This allows a wafer lot to be processed even though a parameter may be out of specification. The continuation of the manufacturing process is because with the additional data, a subsequent process can, in some instances, be adjusted to bring the final wafer back into specification.

If it is determined at 218 that the process just run is the last process, the wafer is subjected to wafer electrical tests (WET) as indicated at 222. If it is determined at 224 that the wafer electrical tests of the wafer are not within the manufacturing specifications, the wafer lot is scrapped at 226. If it is determined at 224 that the wafer electrical tests of the wafer are within the manufacturing specifications, the wafer is sent to the next stage, which could be dicing and packaging as indicated at 228.

Figure 3:
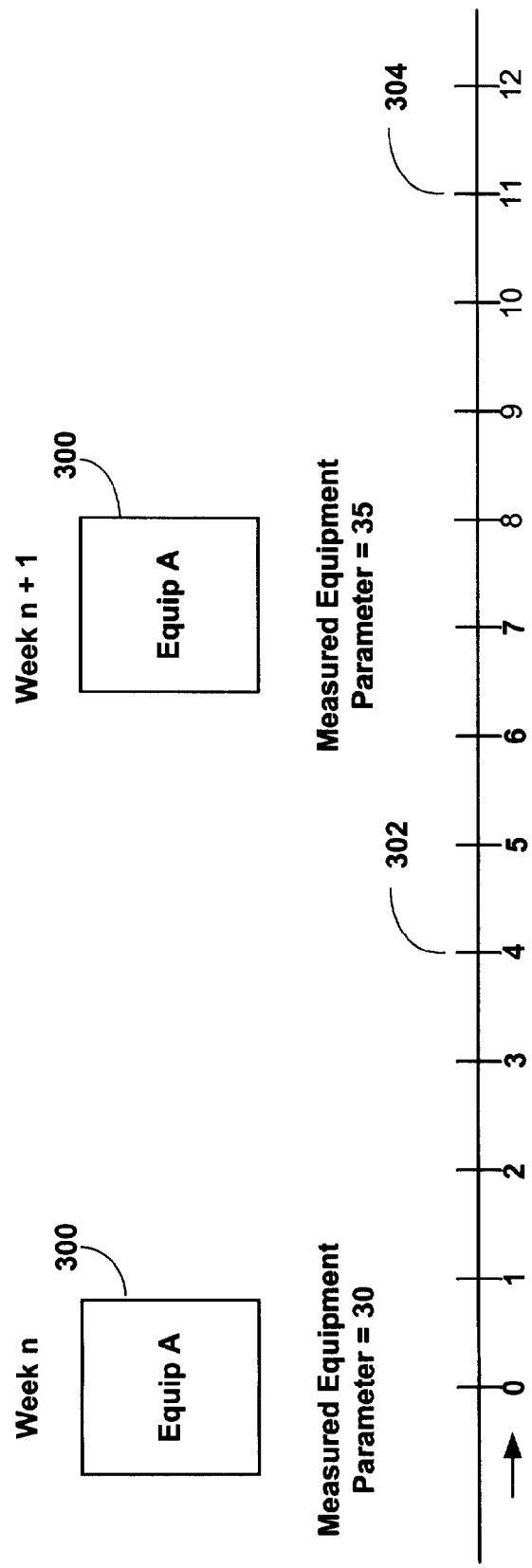
FIG. 3 illustrates the application of the LaPlace-Everett Interpolation to determine an interpolated value and a method to obtain an extrapolated value.

Referring to FIG. 3 there is shown an illustration of the LaPlace-Everett Interpolation for a parameter measured on a piece of equipment, Equipment A. The LaPlace-Everett Interpolation equation is shown below with a numerical example.

La Place – Everett Interpolation

For $f(x)$, assume $x_o$ is known reference point to find $f(x_r)$ $$f(x_r) = f(x_o + rh)$$

$$= \sum_{k=0}^{n} \left[ \binom{r+k}{2k+1} \delta^{2k} f_1 - \binom{r+k-1}{2k+1} \delta^{2k} f_o \right] n = \text{\# data}$$

$$= \left[ rf_1 + \binom{r+1}{3} \delta^2 f_1 + \binom{r+2}{5} \delta^4 f_1 + \ldots + \binom{r+n}{2n+1} \delta^{2n} f_1 \right] +$$

$$\left[ sf_o + \binom{s+1}{3} \delta^2 f_o + \binom{s+2}{5} \delta^4 f_o + \ldots + \binom{s+n}{2n+1} \delta^{2n} f_o \right]$$

$$= \left[ rf_1 + \frac{r(r^2 - 1^2)}{3!} \delta^2 f_1 + \frac{r(r^2 - 1^2)(r^2 - 2^2)}{5!} \delta^4 f_1 + \ldots + \right.$$

$$\left. \frac{1(r^2 - 1^2)(r^2 - 2^2) \ldots (r^2 - n^2)}{(2n+1)!} \delta^{2n} f_1 \right] +$$

$$\left[ sf_o + \frac{s(s^2 - 1^2)}{3!} \delta^2 f_o + \frac{s(s^2 - 1^2)(s^2 - 2^2)}{s!} \delta^4 f_o + \ldots + \right.$$

$$\left. \frac{s(s^2 - 1^2)(s^2 - 2^2) \ldots (s^2 - n^2)}{(2n+1)!} \delta^{2n} f_o \right]$$

where $s = 1 - r$

Example: LaPlace-Everett Interpolation

| $x$ | −0.4 | −0.1 | 0.2 | 0.5 | 0.8 | 1.1 | 1.4 |
|---|---|---|---|---|---|---|---|
| $f(x)$ | 1.851 | 2.705 | 3.624 | 4.696 | 6.037 | 7.802 | 10.206 |

$$(f(x) = 3e^x - x^2)$$

To find $f(x)$ when $x = 0.6$ using LaPlace-Everett Interpolation $$f(0.6) = f(0.5 + 0.3333 \times 0.3)$$

| $x$ | $f(x)$ | $\delta f$ | $\delta^2 f$ | $\delta^3 f$ | $\delta^4 f$ | $\delta^5 f$ | $\delta^6 f$ |
|---|---|---|---|---|---|---|---|
| −0.4 | 1.851 | | | | | | |
| | | 0.854 | | | | | |
| −0.1 | 2.705 | | 0.065 | | | | |
| | | 0.919 | | 0.088 | | | |
| 0.2 | 3.624 | | 0.153 | | 0.028 | | |
| | | 1.072 | | 0.116 | | 0.011 | |
| 0.5 | 4.696 | | 0.269 | | 0.039 | | 0.01 |
| | | 1.341 | | 0.155 | | 0.021 | |
| 0.8 | 6.037 | | 0.424 | | 0.060 | | |
| | | 1.765 | | 0.215 | | | |
| 1.1 | 7.802 | | 0.639 | | | | |
| | | 2.404 | | | | | |
| 1.4 | 10.206 | | | | | | |

-continued $$f(0.6) = \left[0.333 + 6.037 + \frac{0.333 \times (0.333 \times 0.333 - 1)}{6} \times 0.424 + \right.$$
$$\left.\frac{0.333 \times (0.333 \times 0.333 - 1)(0.333 \times 0.333 - 4)}{120} \times 0.06\right] +$$
$$\left[0.667 \times 4.696 + \frac{0.667(0.667 \times 0.667 - 1)}{6} \times 0.269 + \right.$$
$$\frac{0.667(0.667 \times 0.667 - 1)(0.667 \times 0.667 - 4)}{120} \times 0.039 +$$
$$\left.\frac{0.667(0.667 \times 0.667 - 1)(0.667 \times 0.667 - 4)(0.667 \times 0.667 - 9)}{5040} \times 0.01\right.$$
$$= 5.106$$

A selected parameter is measured on Equipment A 300 in week n and the parameter is measured at a value of 30. The same selected parameter is measured on Equipment A 300 during the following week n+1 and the selected parameter is measured at a value of 35. For illustrative purposes, it is shown that the parameter is measured on Equipment A 300 seven days later, however, the parameter could be measured during any day and could be measured during the week n+2 or week n+3 or any subsequent week. In order for the measured equipment parameter to be applicable for a wafer lot that is processed during the interval of time between the time during week n in which the parameter is measured and week n+1 in which the parameter is re-measured it is necessary to convert the equipment or tool based parameter to a lot based parameter. For example, if a lot is processed during day 4, indicated at 302 it is necessary to interpolate between the measured values 30 measured during week n and 35 measured during week n+1. The LaPlace-Everett Interpolation can provide an accurate lot based value for the parameter. In addition, it is also desirable to obtain a value in real time for an equipment parameter for a wafer lot that is being processed during day 11 indicated at 304. This allows for a real time adjustment of the process flow as indicated in steps 206 through 220 (FIG. 2). The value at day 11 304 is obtained by extrapolating the equipment parameter from day 7 (the time of the last equipment measurement of the parameter) to day 11. The extrapolation is done using historical data obtained from the equipment parameter measurements.

The benefits of this invention include:

1. It allows for full use of recorded data for yield and performance calculations.
2. It allows linking the wafer lots to the tool based data for second order dependency study.
3. It allows the real time use of extrapolated data to adjust in real time processing parameters.
4. It provides an expanded dataset that is more descriptive of each lot and yields a more accurate prediction capability.

The foregoing description of the embodiment of the invention has been presented for purposes of illustration and description only. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of utilizing associated process data parameters to predict wafer electrical test results during the manufacture of semiconductor wafers, the method comprising:

starting a wafer in a series of semiconductor manufacturing processes;

setting process parameters for a first process in the series of semiconductor manufacturing processes;

running the first process;

measuring in-line critical dimensions of the wafer after the running of the first process;

determining a first set of lot based data obtained from the measured in-line critical dimensions of the wafer;

converting tool based data obtained from the measured in-line critical dimensions of the wafer to a second set of lot based data by interpolating tool based data between a first measurement obtained from a tool at a first time and a second measurement obtained from the tool at a second time using LaPlace-Everett Interpolation; and predicting wafer electrical test results for the wafer from the measured in-line critical dimensions, the first set of lot based data and the second set of lot based data converted from the tool based data.

2. The method of claim 1 wherein converting tool based data to a second set of lot based data comprises extrapolating tool based data from previously obtained tool based data.

* * * * *